United States Patent
Sasaki et al.

(10) Patent No.: US 9,123,704 B2
(45) Date of Patent: Sep. 1, 2015

(54) SEMICONDUCTOR DEVICE AND METHOD FOR MANUFACTURING THE SAME

(71) Applicant: Kabushiki Kaisha Toshiba, Minato-ku, Tokyo (JP)

(72) Inventors: Yo Sasaki, Saitama-ken (JP); Yuuji Hisazato, Tokyo (JP); Kazuya Kodani, Kanagawa-ken (JP); Atsushi Yamamoto, Tokyo (JP); Hitoshi Matsumura, Kanagawa-ken (JP)

(73) Assignee: Kabushiki Kaisha Toshiba, Minato-Ku, Tokyo (JP)

( * ) Notice: Subject to any disclaimer, the term of this patent is extended or adjusted under 35 U.S.C. 154(b) by 0 days.

(21) Appl. No.: 14/204,203

(22) Filed: Mar. 11, 2014

(65) Prior Publication Data

US 2015/0076699 A1    Mar. 19, 2015

(30) Foreign Application Priority Data

Sep. 13, 2013    (JP) ................. 2013-191132

(51) Int. Cl.
*H01L 23/48* (2006.01)
*H01L 23/52* (2006.01)
*H01L 23/00* (2006.01)

(52) U.S. Cl.
CPC .............. *H01L 23/481* (2013.01); *H01L 24/04* (2013.01); *H01L 24/82* (2013.01); *H01L 2224/82101* (2013.01)

(58) Field of Classification Search
CPC ................. H01L 2924/014; H01L 2924/01327
USPC .................................. 257/772, 762, E23.023
See application file for complete search history.

(56) References Cited

U.S. PATENT DOCUMENTS

| | | | |
|---|---|---|---|
| 6,268,659 B1 | 7/2001 | Huebner et al. | |
| 6,334,567 B1 | 1/2002 | Xie et al. | |
| 6,515,372 B1 * | 2/2003 | Narizuka et al. | 257/779 |
| 6,630,251 B1 * | 10/2003 | Carter et al. | 428/646 |
| 6,727,587 B2 | 4/2004 | Riedl | |
| 6,800,169 B2 | 10/2004 | Liu et al. | |
| 6,872,464 B2 | 3/2005 | Hubner et al. | |
| 6,915,945 B2 | 7/2005 | Hubner | |
| 6,930,383 B2 | 8/2005 | Hacke et al. | |
| 7,148,569 B1 * | 12/2006 | Wang | 257/738 |
| 7,508,012 B2 | 3/2009 | Otremba | |
| 8,232,643 B2 * | 7/2012 | Chuang et al. | 257/738 |
| 2001/0027007 A1 * | 10/2001 | Hosomi et al. | 438/611 |
| 2006/0145352 A1 * | 7/2006 | Soga et al. | 257/772 |
| 2008/0230905 A1 * | 9/2008 | Guth et al. | 257/751 |
| 2008/0315423 A1 * | 12/2008 | Schneegans et al. | 257/762 |
| 2013/0043594 A1 | 2/2013 | Sasaki et al. | |

FOREIGN PATENT DOCUMENTS

| | | |
|---|---|---|
| JP | 2004-174522 A | 6/2004 |
| JP | 2005-032834 A | 2/2005 |
| JP | 2007-189214 A | 7/2007 |

* cited by examiner

*Primary Examiner* — Nitin Parekh
(74) *Attorney, Agent, or Firm* — White & Case LLP (57) ABSTRACT

According to one embodiment, a semiconductor device includes a semiconductor element, an interconnection layer, and a bonding layer. The interconnection layer includes Cu. The bonding layer includes a first alloy that is an alloy of Cu and a first metal other than Cu between the semiconductor element and the interconnection layer. A melting point of the first alloy is higher than a melting point of the first metal.

8 Claims, 7 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2013-191132, filed on Sep. 13, 2013; the entire contents of which are incorporated herein by reference.

FIELD

Embodiments described herein relate generally to a semiconductor device and a method for manufacturing the same.

BACKGROUND

Solder bonding using a solder material is used as a method for mounting a semiconductor element on a mounting substrate in a semiconductor device. Pb—Sn-based materials are used as such solder materials. These days, with the movement toward Pb-free products, also Sn—Ag-based materials and Sn—Ag—Cu-based materials are used.

For the bonding of a semiconductor element and a mounting substrate placed in a high temperature environment in a semiconductor device, Pb—Sn-based solder is widely used even at present when movement toward Pb-free products is in progress. It is important to improve the long-term reliability of the semiconductor device when it is continued to be used in a high temperature environment.

DETAILED DESCRIPTION

In general, according to one embodiment, a semiconductor device includes a semiconductor element, an interconnection layer, and a bonding layer. The interconnection layer includes Cu. The bonding layer includes a first alloy that is an alloy of Cu and a first metal other than Cu between the semiconductor element and the interconnection layer. A melting point of the first alloy is higher than a melting point of the first metal.

Various embodiments will be described hereinafter with reference to the accompanying drawings. In the following description, identical components are marked with the same reference numerals, and a description of components once described is omitted as appropriate.

First Embodiment

Figure 1A:
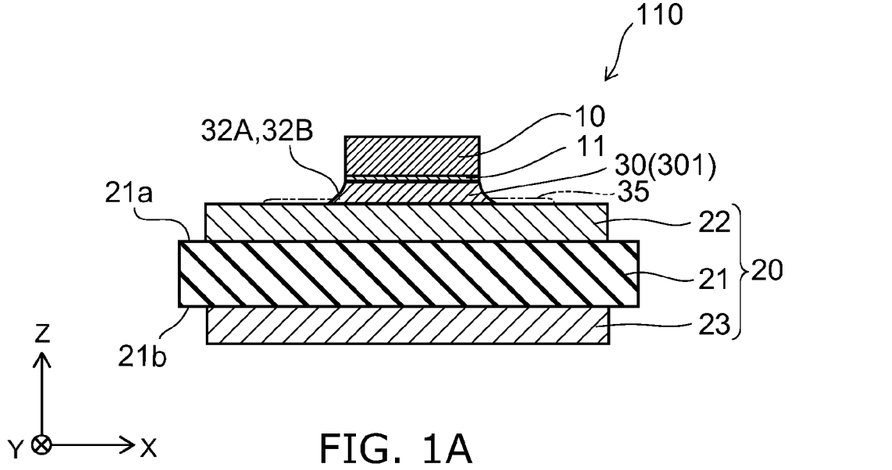
FIG. 1A and FIG. 1B are schematic views illustrating the configuration of a semiconductor device according to a first embodiment.
Figure 1B:
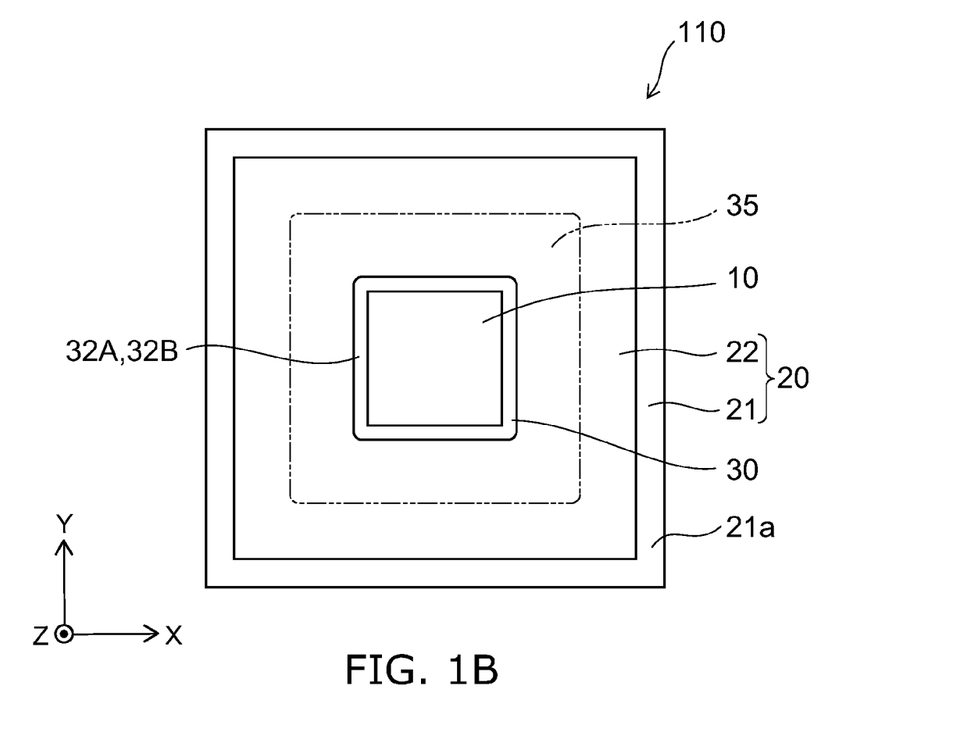

FIG. 1A and FIG. 1B are schematic views illustrating the configuration of a semiconductor device according to a first embodiment.

FIG. 1A shows a schematic cross-sectional view of a semiconductor device 110. FIG. 1B shows a schematic plan view of the semiconductor device 110.

As shown in FIG. 1A, the semiconductor device 110 according to the embodiment includes a semiconductor element 10, a first interconnection layer 22, and a bonding layer 30. The semiconductor element 10 is a piece cut out in a chip form from a semiconductor wafer on which elements (e.g. transistors, diodes) are formed, for example. As the semiconductor material of the semiconductor element 10, silicon (Si), silicon carbide (SiC), gallium nitride (GaN), or the like are used, for example. The semiconductor element 10 includes a power transistor using SiC or GaN, for example.

A metal electrode 11 is provided on the back surface of the semiconductor element 10, for example. Nickel (Ni) is used for the metal electrode 11, for example.

The first interconnection layer 22 is provided on a mounting substrate 20, for example. The mounting substrate 20 includes an insulating substrate 21, the first interconnection layer 22, and a second interconnection layer 23, for example. Silicon nitride (SiN) or aluminum nitride (AlN) is used for the insulating substrate 21, for example. The insulating substrate 21 has a first surface 21a and a second surface 21b on the opposite side to the first surface 21a. In the embodiment, the direction orthogonal to the first surface 21a is defined as the Z-direction, one direction orthogonal to the Z-direction is defined as the X-direction, and the direction orthogonal to the Z-direction and the X-direction is defined as the Y-direction.

In the embodiment, the first interconnection layer 22 is provided on the first surface 21a of the insulating substrate 21. The second interconnection layer 23 is provided on the second surface 21b of the insulating substrate 21. The first interconnection layer 22 includes copper (Cu). The second interconnection layer 23 includes Cu, for example.

As shown in FIG. 1B, the external shape of the insulating substrate 21 as viewed in the Z-direction is a rectangle, for example. The first interconnection layer 22 is formed uniformly on the first surface 21a of the insulating substrate 21, for example. The size of the first interconnection layer 22 is larger than the size of the external shape of the semiconductor element 10. The area of the first interconnection layer 22 is preferably large in order to release the heat of the semiconductor element 10 with good efficiency.

The bonding layer 30 is provided between the semiconductor element 10 and the first interconnection layer 22. The bonding layer 30 includes a first alloy 301. The first alloy 301 is an alloy of Cu and a first metal other than Cu. The first alloy 301 includes an alloy of the first metal and the Cu included in the first interconnection layer 22.

The composition of the first alloy 301 is substantially uniform between the semiconductor element 10 and the first interconnection layer 22. "The composition is substantially uniform" is a concept that includes not only the case where the composition is exactly the same but also the case where errors in the manufacturing may be included. The melting point of the first alloy 301 is higher than the melting point of the first metal.

As the first metal included in the first alloy 301, a material having a melting point of 420° C. or less is used, for example. The first metal is one selected from the group consisting of Sn, Zn, and In, for example. The first metal may be an alloy (a second alloy) of at least two selected from the group consisting of Sn, Zn, In, Au, and Ag.

In the case where Sn, for example, is used as the first metal, the first alloy 301 is an alloy of Cu and Sn. The melting point of Sn is 232° C., for example. The first alloy 301 is an alloy having a melting point higher than the melting point of Sn, which is the first metal. The melting point of $Cu_3Sn$, which is an alloy of Cu and Sn, is approximately 700° C., for example.

By the melting point of the first alloy 301 being higher than the melting point of the first metal, when the semiconductor element 10 is mounted on the mounting substrate 20 via the bonding layer 30, the first metal is melted at a relatively low temperature to be alloyed with the Cu of the first interconnection layer 22.

Since the melting point of the first alloy 301 is higher than the melting point of the first metal, a heat-resistant temperature much higher than the temperature in mounting the semiconductor element 10 is obtained after the mounting of the semiconductor element 10 is completed. Thereby, the reliability of the bonding layer 30 can be improved even in a high temperature environment.

The bonding layer 30 is different from bonding layers using Pb—Sn-based solder, Sn—Ag-based solder, and Sn—Ag—Cu-based solder, which are common solders. In the case where the semiconductor element 10 is mounted on the mounting substrate 20 using a common solder, the portion that forms an alloy with the Cu of the first interconnection layer 22 is only a portion of the solder near the interface with the first interconnection layer 22. In the embodiment, the bonding layer 30 is alloyed overall between the semiconductor element 10 and the first interconnection layer 22. Thereby, the melting point of the bonding layer 30 is made almost equal to the melting point of the first alloy 301. Here, in the case where $Cu_3Sn$, which is an alloy of Cu and Sn, is used as the solder, the semiconductor element 10 cannot be bonded unless heating is performed to a high temperature of, for example, 700° C. or more, which is the melting point of $Cu_3Sn$. However, in the case where the first metal is alloyed with Cu like the embodiment, the semiconductor element 10 can be bonded when heating is performed to the melting point of the first metal (e.g. 232° C.), which is much lower than the melting point of $Cu_3Sn$.

The thickness of the bonding layer 30 is approximately not less than 1 micrometer (μm) and not more than 100 μm, for example. A preferable thickness of the bonding layer 30 is not less than 5 μm and not more than 50 μm. A more preferable thickness of the bonding layer 30 is not less than 5 μm and not more than 20 μm. When the thickness of the bonding layer 30 is thinned, the thermal resistance is reduced to allow heat radiation with good efficiency.

Although Sn is taken as an example of the first metal in the above description, an alloy of two or more elements of Sn, Zn, In, Au, Ag, and Cu may be used as well as Sn. For example, by using an In—Sn—Zn eutectic alloy (eutectic temperature: 108° C.), the bonding temperature is lowered to 108° C. Thereby, the semiconductor element 10 and the mounting substrate 20 can be bonded together at a still lower temperature.

Next, a fillet portion of the bonding layer 30 is described.

Figure 2A:
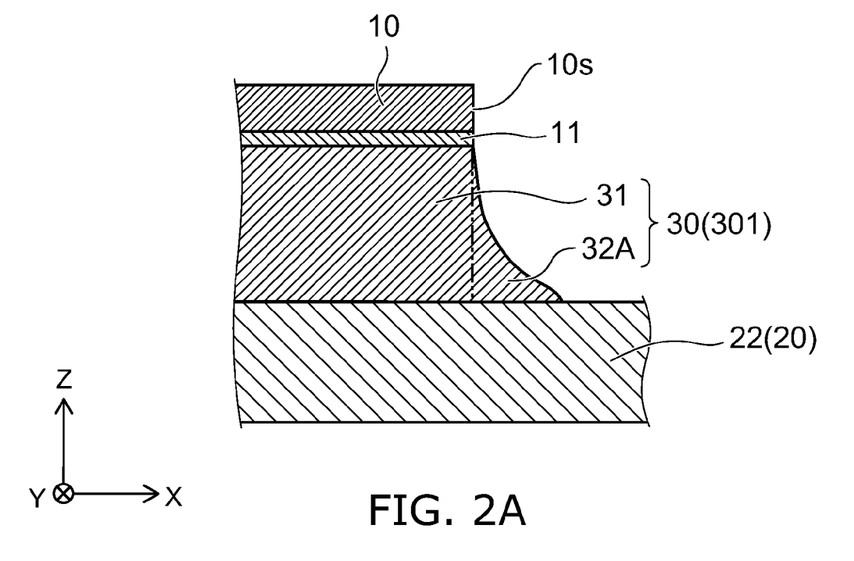
FIG. 2A and FIG. 2B are schematic cross-sectional views illustrating fillet portions.
Figure 2B:
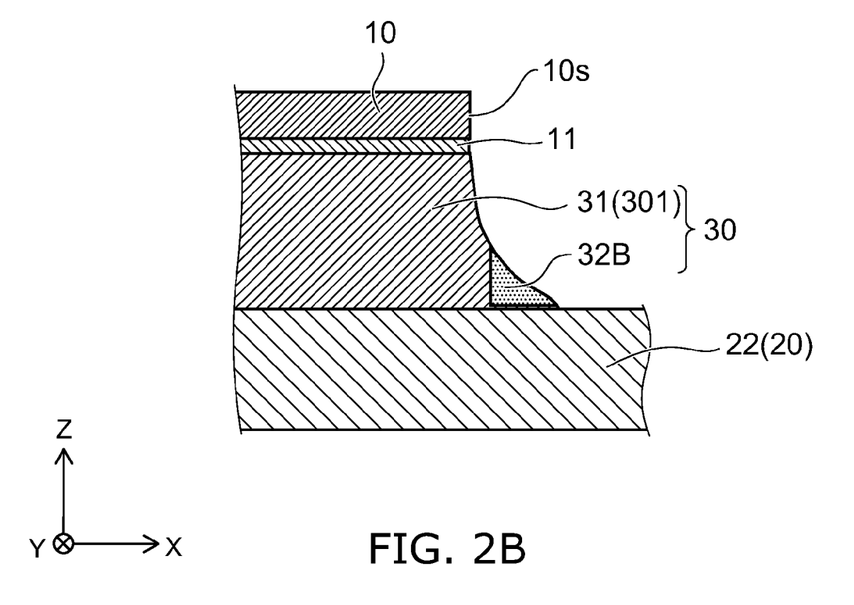

FIG. 2A and FIG. 2B are schematic cross-sectional views illustrating fillet portions.

FIG. 2A shows a fillet portion 32A according to a first example, and FIG. 2B shows a fillet portion 32B according to a second example. FIG. 2A and FIG. 2B show schematic enlarged cross-sectional views of the fillet portions 32A and 32B, respectively.

As shown in FIG. 2A, a fillet portion 32A may be provided in the bonding layer 30. The bonding layer 30 has a central portion 31 overlapping with the semiconductor element 10 as viewed in the Z-direction. The fillet portion 32A is, as viewed in the Z-direction, a portion spreading to the outside of the position of the end 10s of the semiconductor element 10, that is, a portion provided on the outside of the central portion 31. The fillet portion 32A is a foot portion of the bonding layer 30.

As shown in FIG. 1B, the fillet portion 32A is provided so as to surround the outside of the semiconductor element 10 as viewed in the Z-direction. As shown in FIG. 2A, the ridgeline of the fillet portion 32A may be in a rectilinear form or a curved form.

The central portion 31 is made of the first alloy 301 with a substantially uniform composition. Also the fillet portion 32A is made of the first alloy 301 with a substantially uniform composition.

When the semiconductor element 10 is operated, heat is generated. The stress resulting from the heat is applied to the bonding layer 30. By the fillet portion 32A like this being provided, stress concentration at the end of the central portion 31 is suppressed. Furthermore, since the central portion 31 and the fillet portion 32A are made of the first alloy 301 with a uniform composition, a strong bonding layer 30 is obtained as compared to the case where the composition is not uniform. That is, if the composition is not uniform, a defect such as a crack is likely to occur in the interface portion between the different compositions. Since the central portion 31 and the fillet portion 32A are a uniform composition, such a defect is less likely to occur. By these, the long-term reliability of the bonding layer 30 is enhanced.

A fillet portion 32B according to the second example shown in FIG. 2B includes the first metal in a larger amount than the first alloy 301. Alternatively, the fillet portion 32B does not include the first alloy 301. The fillet portion 32B may be made of only the first metal.

As shown in FIG. 1B, the fillet portion 32B is provided so as to surround the outside of the semiconductor element 10 as viewed in the Z-direction. As shown in FIG. 2B, the ridgeline of the fillet portion 32B may be in a rectilinear form or a curved form.

The central portion 31 of the bonding layer 30 shown in FIG. 2B is made of the first alloy 301 with a substantially uniform composition. On the other hand, the fillet portion 32B is a portion where the alloying of the first metal and the Cu of the first interconnection layer 22 is not actively made. Depending on the manufacturing conditions, the first alloy 301 may be formed in an interface portion with the first interconnection layer 22 of the fillet portion 32B.

By the fillet portion 32B like this being provided, when a crack has occurred in the bonding layer 30, the crack is repaired by the action described below by means of the first metal of the fillet portion 32B.

Figure 3A:
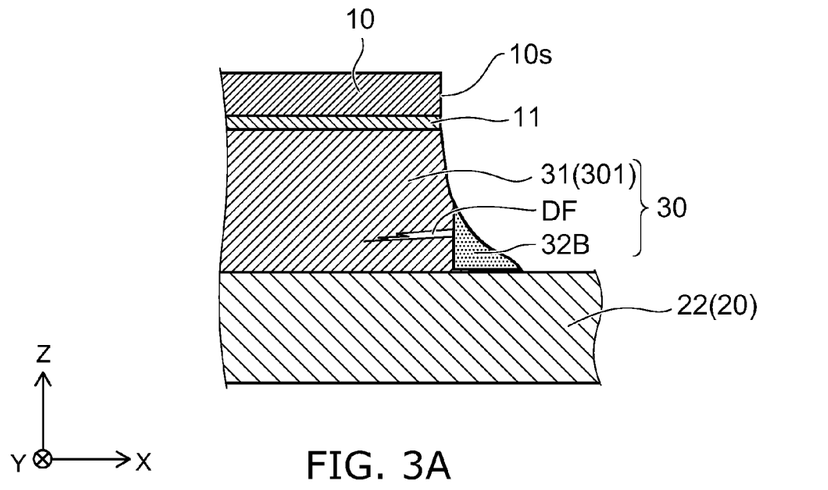
FIG. 3A and FIG. 3B are schematic cross-sectional views illustrating the action of the fillet portion.
Figure 3B:
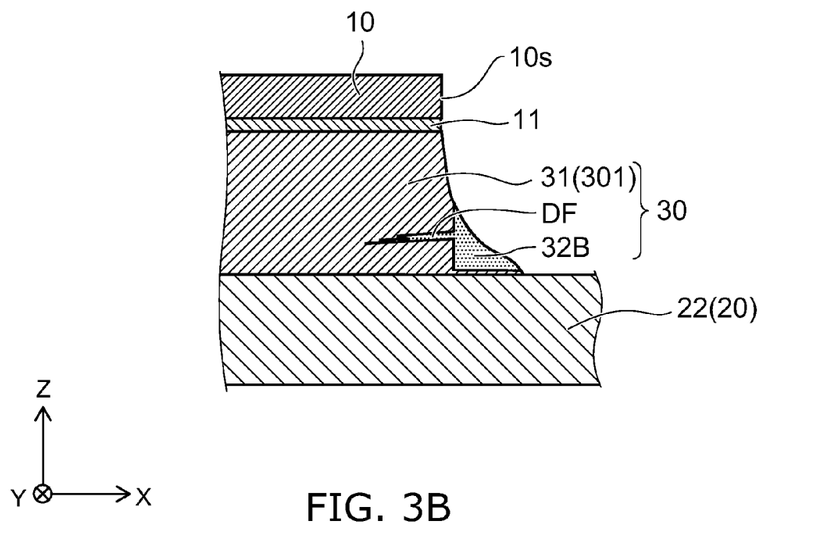

FIG. 3A and FIG. 3B are schematic cross-sectional views illustrating the action of the fillet portion.

FIG. 3A shows the state of a crack DF that has occurred in the bonding layer 30. FIG. 3B shows the manner of the repair of the crack DF.

It is assumed that a crack DF has occurred in the bonding layer 30 due to stress concentration or the like as shown in FIG. 3A, for example. When in this state the semiconductor device 110 is exposed to a high temperature environment (for example, not less than the melting point of the first metal), the first metal in the fillet portion 32B becomes a molten state. For example, when the first metal is Sn, the Sn in the fillet portion 32B becomes a molten state at 232° C. or more.

When the first metal in the fillet portion 32B has become a molten state, the molten first metal flows into the crack DF as shown in FIG. 3B. The first metal is embedded in the crack DF. Depending on the temperature after that, the first metal embedded in the crack DF forms an alloy with Cu. Thereby, the crack DF is eliminated.

By the fillet portion 32B being provided, the development of the crack DF can be repaired at the initial stage of its occurrence. Thus, the long-term reliability of the bonding layer 30 can be dramatically improved.

Although Sn has been taken as an example of the first metal of the fillet portion 32B, a simple substance of In or an alloy of two or more elements of Sn, Zn, In, Au, Ag, and Cu may be used; thereby, a repair temperature suitable for a high temperature environment to which the bonding layer 30 is exposed can be set.

Figure 4:
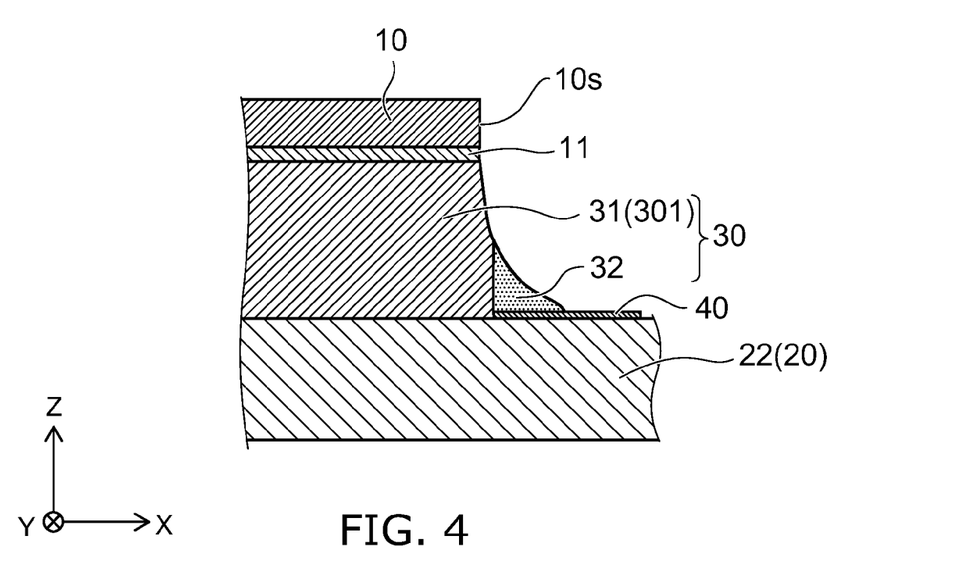
FIG. 4 is a schematic cross-sectional view illustrating the configuration of a variation.

FIG. 4 is a schematic cross-sectional view illustrating the configuration of a variation.

FIG. 4 shows a schematic enlarged cross-sectional view of a fillet portion and its vicinity.

In the variation shown in FIG. 4, a barrier layer 40 is provided between the fillet portion 32B and the first interconnection layer 22. The barrier layer 40 is a layer that suppresses the diffusion of Cu from the first interconnection layer 22 to the fillet portion 32B.

By the barrier layer 40 like this being provided, the interdiffusion and the reaction between the first metal included in the fillet portion 32B and the Cu included in the first interconnection layer 22 are suppressed. Thereby, the alloying of the fillet portion 32B with Cu is suppressed for a long period. That is, the effect of the elimination of a crack DF described above can be maintained for a long period.

As the material of the barrier layer 40, any material may be used whereby the interdiffusion coefficient between the first metal and the Cu included in the first interconnection layer 22 is low and the growth rate of an intermetallic compound of both is low. As the material of the barrier layer 40, for example, Ni, cobalt (Co), chromium (Cr), tantalum (Ta), and tungsten (W) are suitable.

Second Embodiment

Next, a method for manufacturing a semiconductor device according to a second embodiment is described.

Figure 5:
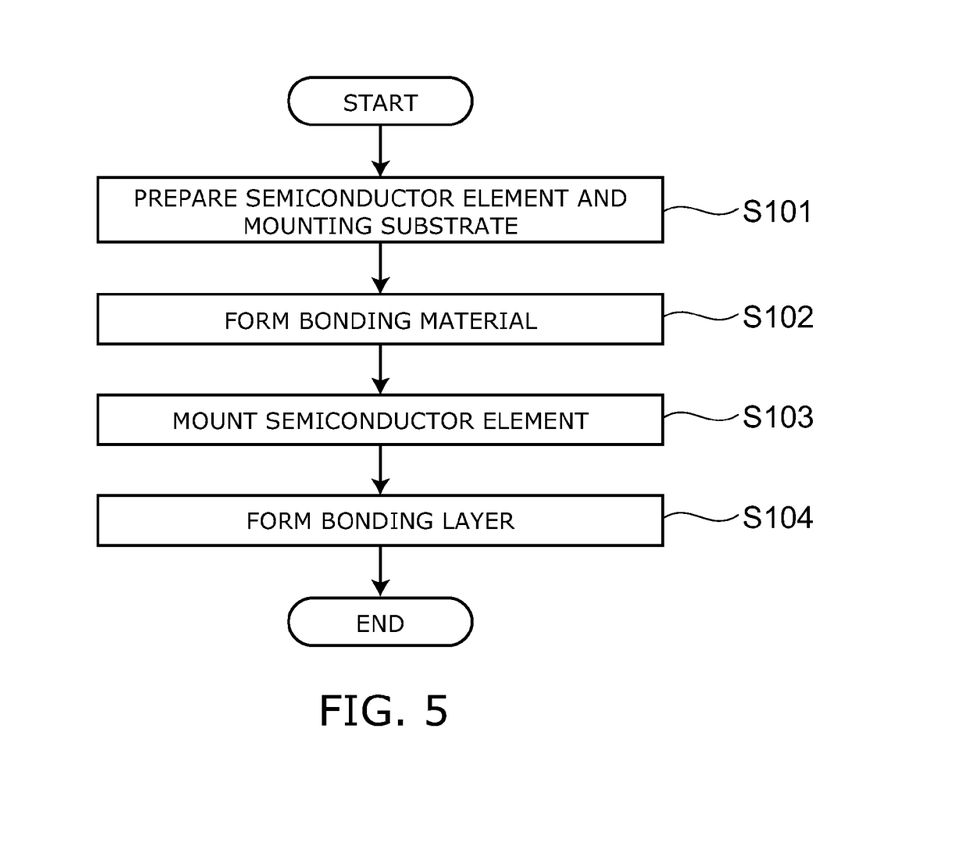
FIG. 5 is a flow chart illustrating a method for manufacturing a semiconductor device according to a second embodiment.

FIG. 5 is a flow chart illustrating a method for manufacturing a semiconductor device according to the second embodiment.

As shown in FIG. 5, the method for manufacturing a semiconductor device according to the embodiment includes preparing a semiconductor element and a mounting substrate (step S101), forming a bonding material (step S102), mounting the semiconductor element (step S103), and forming a bonding layer (step S104).

In step S101, the semiconductor element 10 and the mounting substrate 20 described above are prepared. The mounting substrate 20 includes the first interconnection layer 22 including Cu.

In step S102, a bonding material including the first metal other than Cu is provided on the first interconnection layer 22 of the mounting substrate 20.

Figure 6A:
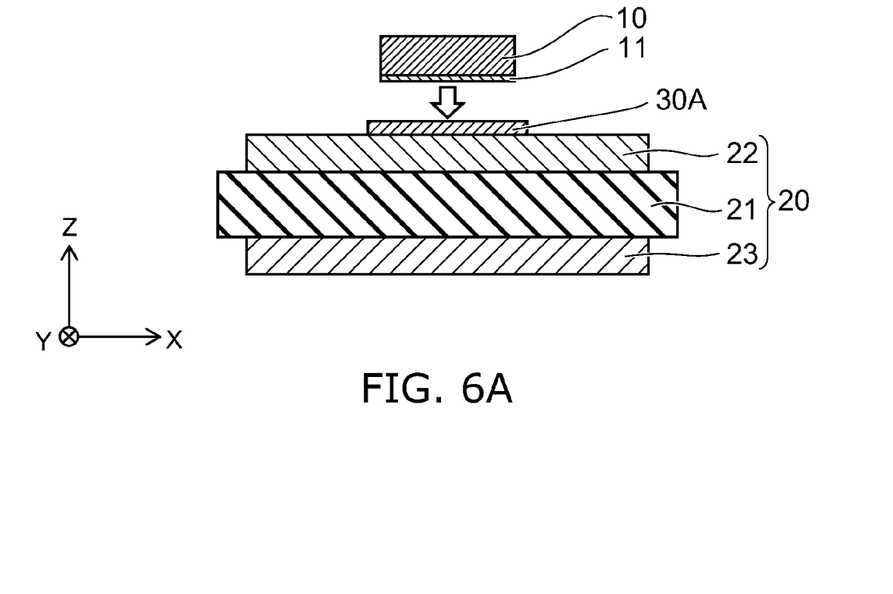
FIG. 6A and FIG. 6B are schematic cross-sectional views illustrating the formation of bonding materials.
Figure 6B:
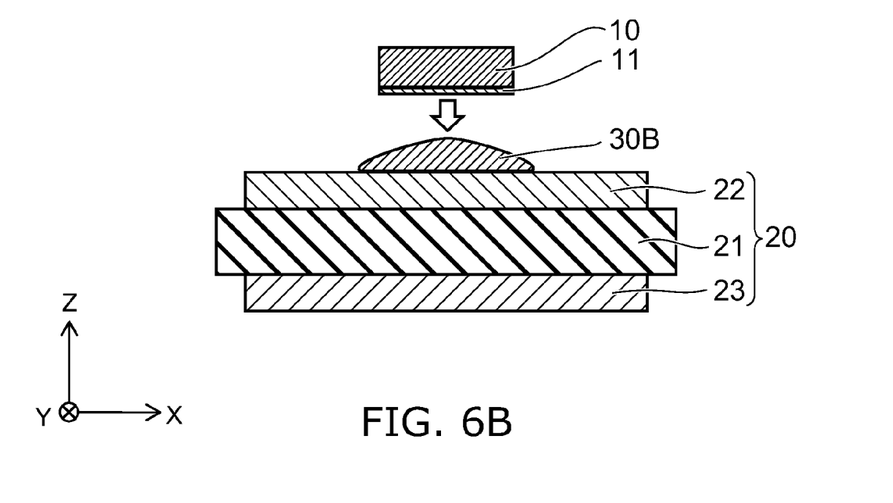

FIG. 6A and FIG. 6B are schematic cross-sectional views illustrating the formation of bonding materials.

In the example shown in FIG. 6A, a sheet-like bonding material 30A made of the first metal is formed on the first interconnection layer 22. The bonding material 30A is a sheet material of Sn, for example.

A bonding material 30B shown in FIG. 6B is formed by dropping the first metal in a molten state (dip). The bonding material 30B may be formed by melting a bulk material of the first metal. For example, the mounting substrate 20 may be heated, and a bulk material of the first metal (e.g. Sn) may be pressed against the upper surface of the first interconnection layer 22 and melted.

In step S103, the semiconductor element 10 is mounted on the first interconnection layer 22 via the bonding materials 30A and 30B.

In step S104, the bonding materials 30A and 30B are melted to form the bonding layer 30. That is, the bonding materials 30A and 30B are heated to a temperature higher than the melting point of the first metal, and are kept as it is for a certain period to be isothermally solidified. Thereby, the first alloy 301 with a substantially uniform composition is formed between the semiconductor element 10 and the first interconnection layer 22. The melting point of the first alloy 301 is higher than the melting point of the first metal.

Figure 7:
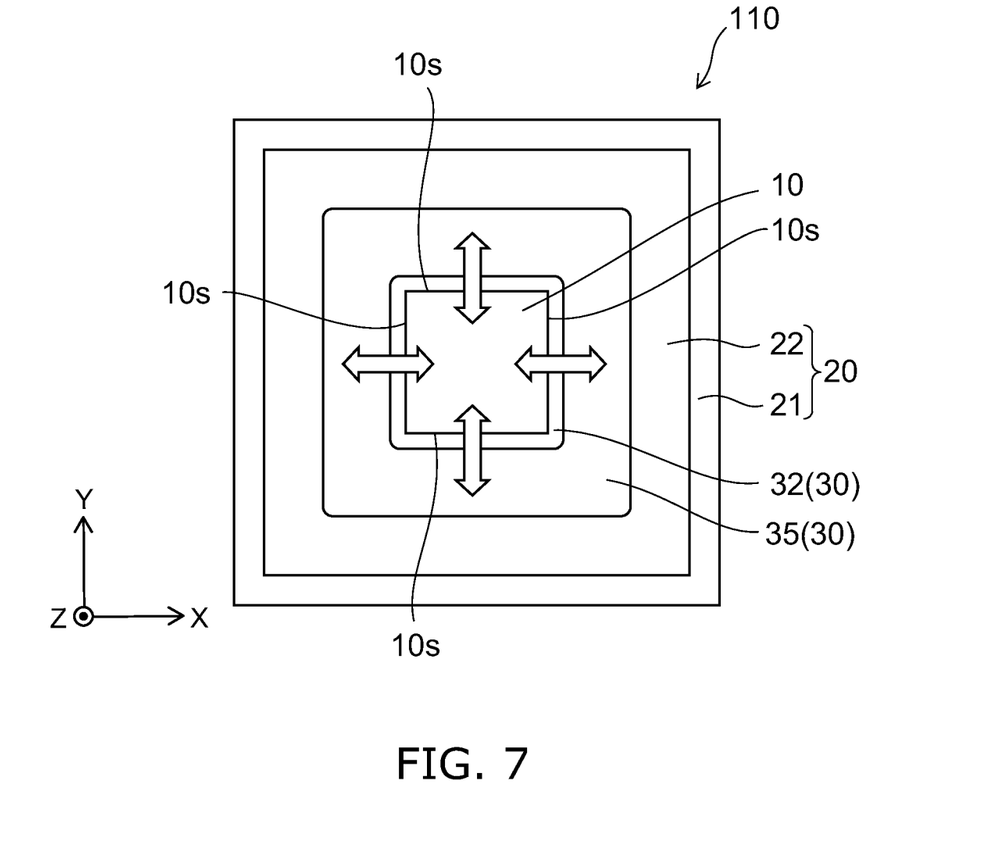
FIG. 7 is a schematic plan view illustrating the oscillatory motion of the semiconductor element.

FIG. 7 is a schematic plan view illustrating the oscillatory motion of the semiconductor element.

In the process of forming the bonding layer 30 in step S104, the semiconductor element 10 may be oscillated in a direction along the surface of the first interconnection layer 22 in a state where the bonding materials 30A and 30B are heated at a temperature higher than the melting point of the first metal.

As shown in FIG. 7, the semiconductor element 10 is slid in a direction along the surface of the first interconnection layer 22 (e.g. the X-direction, the Y-direction) in a state where the semiconductor element 10 is mounted. In the sliding of the semiconductor element 10, the semiconductor element 10 may be moved backward and forward in each of the X-direction and the Y-direction.

By oscillating the semiconductor element 10 in a state of being heated at a temperature higher than the melting point of the first metal, the fillet portions 32A and 32B are formed in the bonding layer 30. By oscillating the semiconductor element 10, the occurrence of voids in the bonding layer 30 is effectively suppressed.

By oscillating the semiconductor element 10, the bonding materials 30A and 30B spread over a large area of the surface of the first interconnection layer 22 to provide a protrusion portion 35 on the outside of the fillet portions 32A and 32B. Since the protrusion portion 35 is provided on the outside continuously from the fillet portions 32A and 32B, strong connection of the semiconductor element 10 is obtained, and the heat dissipation performance to the first interconnection layer 22 side is enhanced.

The fillet portion 32B shown in FIG. 2B is formed by the setting of the thickness of the bonding materials 30A and 30B, the setting of the duration for isothermal solidification, the setting of the applied pressure in the oscillatory motion of the semiconductor element 10, etc. For example, to form the fillet portion 32B, the thickness of the bonding materials 30A and 30B is set thicker (for example, 50 μm or more) than when the fillet portion 32A is formed. To form the fillet portion 32B, the duration for isothermal solidification is set shorter than when the fillet portion 32A is formed. To form the fillet portion 32B, the applied pressure in the oscillatory motion of the semiconductor element 10 is set higher than when the fillet portion 32A is formed.

The formation of the bonding layer 30 of step S104 may be performed while a prescribed pressure is applied in an inert atmosphere as necessary. The formation of the bonding layer 30 may be performed in a reducing atmosphere. That is, the formation of the bonding layer 30 is preferably performed in an atmosphere where the oxidation of the bonding layer 30 is suppressed. Thereby, the oxidation of the bonding layer 30 is suppressed.

A cap layer of Au or the like may be provided on the metal electrode 11 of the semiconductor element 10 and on the bonding material 30A. By providing the cap layer, the oxidation of the bonding layer 30 is suppressed even in an atmosphere other than an inert atmosphere and a reducing atmosphere, and mounting by simpler equipment is enabled.

Thus, through the processing of step S101 to step S104, the semiconductor device 110 in which the semiconductor element 10 is mounted on the mounting substrate 20 via the bonding layer 30 is completed.

Here, alloying with Cu in the case where Sn is used as the first metal is described as an example.

Figure 8:
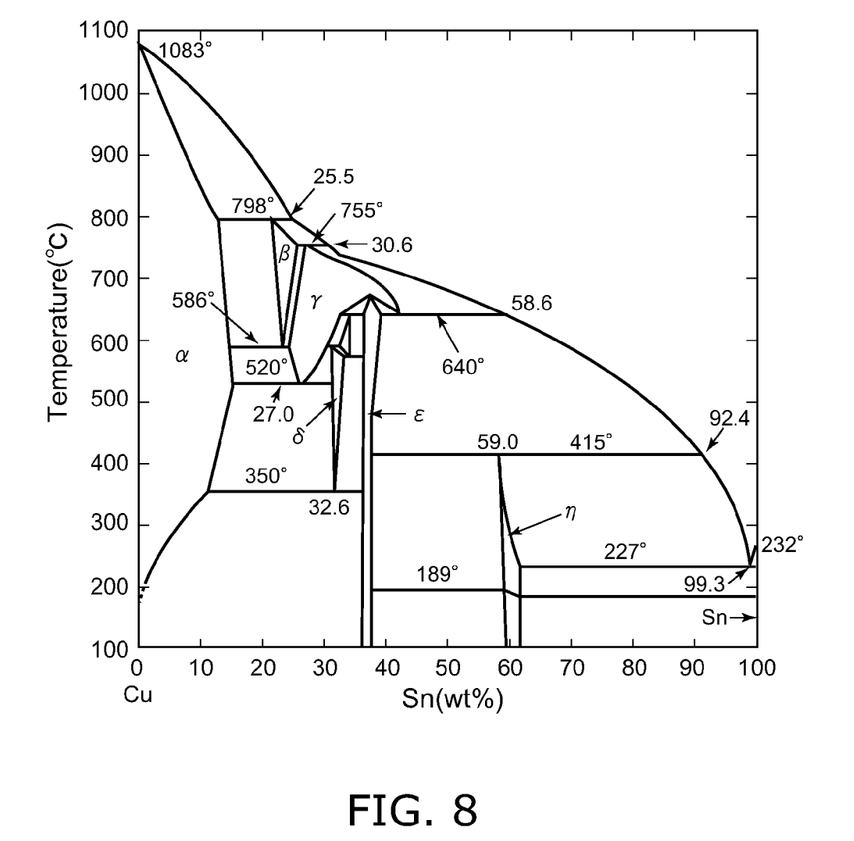
FIG. 8 is a Cu—Sn binary equilibrium diagram.

FIG. 8 is a Cu—Sn binary equilibrium diagram.

In a system in which Cu and Sn are main components, the intermetallic compound of the first alloy 301 of the bonding layer 30 changes from $Cu_6Sn_5$ (the η phase shown in FIG. 8) to $Cu_3Sn$ (the ε phase shown in FIG. 8) through isothermal solidification. However, since $Cu_3Sn$ is a stable compound, further change is less likely to occur at the process temperature at which the semiconductor element is mounted and the bonding layer is formed. Thus, the bonding layer 30 including the first alloy 301 of $Cu_3Sn$ is excellent in long-term reliability.

Furthermore, when the bonding layer 30 has the fillet portions 32A and 32B, extreme concentration of stress resulting from the heat generated when the semiconductor element 10 is operated is suppressed, and the long-term reliability of the bonding layer 30 is enhanced.

Although an alloy of Cu and Sn is taken as an example of the first alloy 301 in the examples described above, other alloys may be used. As other alloys, an alloy of Cu and Zn, an alloy of Cu, Sn, and Ag, and the like are given. The case where an alloy of Cu and Zn is used is described, for example. In this case, Zn is used as the first metal, and an alloy phase of a brass or β brass is formed as the bonding layer 30 by the isothermal solidification reaction of liquid phase Zn and Cu. Since these brasses are excellent in expandability, the thermal stress acting on the bonding layer 30 is effectively relaxed by these brasses expanding and contracting easily. The case where an alloy of Cu, Sn, and Ag is used is described, for example. In this case, an alloy in which Ag is added to Sn is used as the first metal. By adding Ag to Sn, the surface oxidation when the first metal is melted is suppressed. Thereby, the occurrence of voids due to the entanglement of an oxide film is effectively suppressed, and the reliability of the bonding layer 30 is improved.

The method for manufacturing a semiconductor device according to the embodiment can enhance the long-term reliability of the bonding layer 30.

As described above, the semiconductor device and the method for manufacturing the same according to the embodiment can improve the reliability of the bonding portion between a semiconductor element and a mounting substrate even in a high temperature atmosphere.

The embodiments and variations are described above, however the invention is not limited to these examples. For example, any addition, deletion, or design change of components, or appropriate combination of features of the embodiments suitable made by those skilled in the art are also encompassed within the scope of the invention as long as they fall within the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a substrate;
a semiconductor element;
an interconnection layer including Cu;
a bonding layer including a first alloy between the semiconductor element and the interconnection layer, the first alloy being an alloy of Cu and a first metal other than Cu, a melting point of the first alloy being higher than a melting point of the first metal, the bonding layer being provided between the substrate and the semiconductor element, the bonding layer including a first portion and a second portion, the first portion being within at least one end of the semiconductor element, the second portion spreading outside of the at least one end of the semiconductor element, and the first portion being made of the first alloy with a uniform composition, and the substrate comprising the interconnection layer, an insulating substrate, and a second interconnection layer, wherein the insulating substrate is between the interconnection layer and the second interconnection layer.

2. The device according to claim 1, wherein the first metal is one selected from the group consisting of tin (Sn), zinc (Zn), and indium (In).

3. The device according to claim 1, wherein the first metal is a second alloy of at least two selected from the group consisting of tin (Sn), zinc (Zn), indium (In), gold (Au), silver (Ag), and copper (Cu).

4. The device according to claim 1, wherein the second portion having at least portion including the first metal in a larger amount than the first portion.

5. The device according to claim 1, wherein
the first portion is configured to form an alloy with the interconnection layer more easily than the second portion.

6. The device according to claim 1, wherein
the first portion and the second portion include the first alloy, and
the second portion includes the first metal in a larger amount than the first portion.

7. The device according to claim 1, further comprising a barrier layer provided between the second portion and the interconnection layer and configured to suppress diffusion of copper (Cu) from the interconnection layer to the second portion.

8. The device according to claim 7, wherein a material of the barrier layer includes one of nickel (Ni), cobalt (Co), chromium (Cr), tantalum (Ta), and tungsten (W).

* * * * *